(12) United States Patent
Lee et al.

(10) Patent No.: US 7,675,288 B2
(45) Date of Patent: Mar. 9, 2010

(54) TUNABLE MAGNETIC FIELD AMPLIFYING DEVICE

(75) Inventors: Wangjoo Lee, Daejon (KR); Dong-Ho Kim, Daejon (KR); Jae-Ick Choi, Daejon (KR)

(73) Assignee: Electronics and Telecommunications Research Institute, Daejon (KR)

( * ) Notice: Subject to any disclaimer, the term of this patent is extended or adjusted under 35 U.S.C. 154(b) by 19 days.

(21) Appl. No.: 12/182,359

(22) Filed: Jul. 30, 2008

(65) Prior Publication Data

US 2009/0153275 A1    Jun. 18, 2009

(30) Foreign Application Priority Data

Dec. 12, 2007    (KR) ...................... 10-2007-0129017

(51) Int. Cl.
*G01V 3/00*    (2006.01)
*H01P 7/00*    (2006.01)
(52) U.S. Cl. ....................... 324/322; 333/221
(58) Field of Classification Search ................. 324/322, 324/318; 333/219, 221
See application file for complete search history.

(56) References Cited

U.S. PATENT DOCUMENTS 4,973,908 A * 11/1990 Bottomley et al. .......... 324/318
5,500,552 A * 3/1996 Ikeda et al. .................. 257/531
5,959,515 A * 9/1999 Cornett et al. ................ 334/14
6,480,110 B2 * 11/2002 Lee et al. .................. 340/572.5
6,791,432 B2   9/2004 Smith et al.
7,081,753 B2 * 7/2006 Mullen et al. ............... 324/318
7,385,398 B2 * 6/2008 Zeiger et al. ................ 324/318
2009/0237178 A1* 9/2009 Lee et al. ..................... 333/185

FOREIGN PATENT DOCUMENTS

JP    62-190708 A    8/1987

OTHER PUBLICATIONS

Pendry et al.; Magnetism from Conductors and Enhanced Nonlinear Phenomena; IEEE Transactions on Microwave Theory and Techniques, vol. 47, No. 11, Nov. 1999; pp. 2075-2084.
Wiltshire et al.; Microstructured Magnetic Materials for RF Flux Guides in Magnetic Resonance Imaging; Science, vol. 291, Feb. 2, 2001; pp. 849-851.

* cited by examiner

*Primary Examiner*—Louis M Arana
(74) *Attorney, Agent, or Firm*—Rabin & Berdo, P.C.

(57) ABSTRACT

Provided is a tunable magnetic field amplifying device capable of easily adjusting resonance frequencies and tuning usable bands by using discrete elements to vary electric properties of elements that are used for amplifying a magnetic field of a specific microwave band. The tunable magnetic field amplifying device includes a Swiss roll formed by winding a metal sheet coated with a dielectric in a spiral cylinder shape once or several times; and a tunable capacitor connected between an inner sheet of and an outer sheet of the metal sheet for tuning a resonance frequency.

10 Claims, 4 Drawing Sheets

TUNABLE MAGNETIC FIELD AMPLIFYING DEVICE

CROSS-REFERENCE TO RELATED APPLICATIONS

The present invention claims priority of Korean Patent Application No. 10-2007-0129017, filed on Dec. 12, 2007, which is incorporated herein by reference.

BACKGROUND OF THE INVENTION

1. Field of the Invention

The present invention relates to a tunable magnetic filed amplifying device; and, more particularly, to a magnetic field amplifying device capable of easily adjusting resonance frequencies and varying usable bands by using discrete elements to vary electric properties of elements used for amplifying a magnetic field of a specific microwave band.

2. Description of Related Art

Magnetic Resonance Imaging (MRI) widely used in the diagnosis of disease is a high-tech non-destructive, non-radioactivity inspection method that is excellent in efficacy but causes no load to the human body. The MRI inspection method applies a static magnetic field of about 0.5 Tesla or greater to a target region of a body. Then, protons in the body have a resonance frequency proportional to the strength of a static magnetic field at about several tens of MHz band or higher. When an electromagnetic wave of such resonance frequency is irradiated in the shape of a pulse to the body, protons absorb the energy of the wave and become excited. After a certain period of time, the protons emit electromagnetic waves of the same frequency and lose energy, thereby going down to a low energy state. The wave being generated at this time is called a Magnetic Resonance (MR) signal. The MRI inspection method then receives this MR signal through a receiving antenna and creates 2-D images representing the density distribution of protons.

In general, higher MR signal intensity results in better resolution of MRI images effective for the diagnosis of diseases. The most direct way to increase the MR signal intensity is to increase the strength of a static magnetic field to be applied. According to the law of thermodynamics, protons in human body that actually absorb energy from the external exciting waves and generate MR signal while losing energy are approximately a part per million ($10^{-6}$) of the total number of protons. Since this ratio increases proportionally to the intensity of the static magnetic field, the early MRI equipment mainly used permanent magnets that generate the static magnetic field of 0.5 Tesla or below, but the recent MRI equipment employs superconducting magnets that generate the static magnetic field of 1.5 Tesla or greater. However, the MRI equipment using superconducting magnets, compared to the MRI equipment using permanent magnets, is expensive in individual unit price and maintenance cost, which adds the economic burden to many patients.

Another way to improve the resolution is using contrast media or contrast agents for MRI. In general, contrast media are widely used to improve the resolution for X-ray inspection. MRI contrast media are also actively researched now because they can increase the resolution without placing so much cost burden on the patients. However, the MRI contrast media are used in a drug delivery way, so they may cause inconvenience to patients and it may take some time until they are actually used.

Still another way to improve the resolution is to minimize the electromagnetic loss until a receiving antenna detects MR signals generated from the body. The MR signal is essentially an electromagnetic wave of a specific frequency, and composed of two vector components, an electric field vector and a magnetic field vector. But, unlike typical waves traveling in air or vacuum space environment, the MR signal is characterized that the magnetic field strength has a predominant role over the electric field strength. Therefore, a kind of electrical resonant circuit called Swiss roll, which is very sensitive to a change in magnetic field at a specific frequency, is arranged between the body and a receiving antenna in order that a loss in the MR signal can be reduced. The Swiss roll, which is a magnetic field amplifying device, consists of a central mandrel upon which a spiral metal sheet coated with dielectric is wound in the shape of a cylinder N times, so that when an external magnetic field corresponding to its resonance frequency is inputted, it causes an electromagnetic resonance to amplify the magnetic field strength.

Therefore, reducing a loss in the MR signal by using the resonance phenomenon of the Swiss roll, which is the magnetic field amplifying device, has a merit that patients do not have economic burden or feel inconvenient. However, since self-inductance and capacitance to determine the resonance frequency of the Swiss roll is determined by the geometrical shape, it is very difficult to accurately match the resonance frequency to the MR signal from protons. In addition, although Swiss rolls are manufactured under the identical conditions, mass produced Swiss rolls do not always have a uniform resonance frequency due to the tolerance for error. Moreover, physical property changes of individual Swiss rolls caused by temperature, humidity, etc., give rise to the deviation of the resonance frequency, which cannot be corrected easily.

SUMMARY OF THE INVENTION

It is, therefore, an object of the present invention to provide a magnetic field amplifying device capable of easily adjusting resonance frequencies and tuning usable bands by using discrete elements to vary electric properties of elements that are used for amplifying a magnetic field of a specific microwave band.

In accordance with an aspect of the present invention, there is a tunable magnetic field amplifying device, including: a Swiss roll formed by winding a metal sheet coated with a dielectric in a spiral cylinder shape once or several times; and a tunable capacitor connected between an inner sheet of and an outer sheet of the metal sheet for tuning a resonance.

The tunable magnetic field amplifying device may further include a tunable inductor connected serially to the tunable capacitor for increasing a tunable range of the resonance frequency.

In accordance with another aspect of the present invention, there is a tunable magnetic field amplifying device, including: a Swiss roll formed by winding a metal sheet coated with a dielectric in a spiral cylinder shape once or several times; and a tunable inductor connected between an inner sheet and an outer sheet of the metal sheet for tuning a resonance frequency.

Other objects and advantages of the present invention can be understood by the following description, and become apparent with reference to the embodiments of the present invention. Also, it is obvious to those skilled in the art to which the present invention pertains that the objects and advantages of the present invention can be realized by the means as claimed and combinations thereof.

DESCRIPTION OF SPECIFIC EMBODIMENTS

The advantages, features and aspects of the invention will become apparent from the following description of the embodiments with reference to the accompanying drawings, which is set forth hereinafter, and thus, the present invention will easily be carried out by those skilled in the art. Further, in the following description, well-known arts will not be described in detail if they could obscure the invention in unnecessary detail. Hereinafter, preferred embodiments of the present invention will be described in detail with reference to the accompanying drawings.

Figure 1:
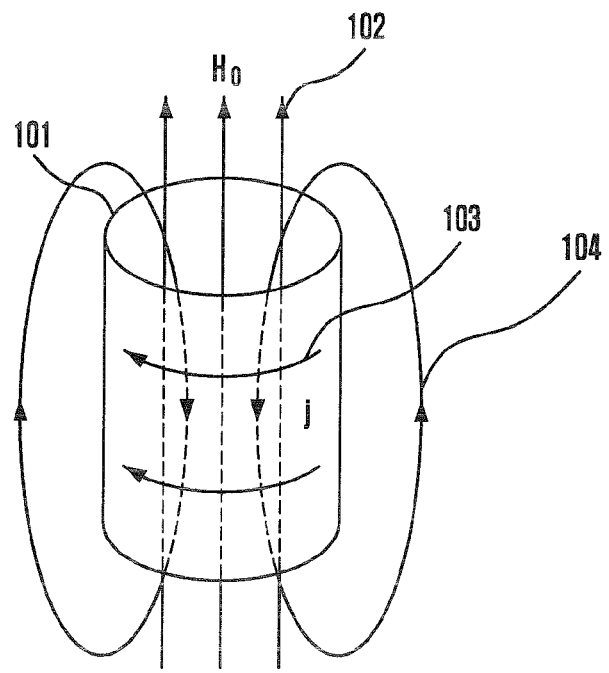
FIG. 1 is a view for explaining an induced current and an induced magnetic field according to a magnetic field change.

For a better understanding about a tunable magnetic field amplifying device, a structure 101 upon which a thin metal foil with a radius r is wound in the shape of a cylinder as shown in FIG. 1 will be explained first, before explaining the present invention.

According to Lenz's law, when the strength of an external magnetic field 102 passing through the cylinder in an axial direction is changed, a voltage proportional to the rate of external magnetic field changes is generated in the circumference direction of the cylinder, and an induced current 103 flows in the circumference direction. This induced current creates an induced magnetic field 104 again to influence the strength of the external magnetic field, and this causes a feedback that in turn influences the induced current and the induced magnetic field. To express this in a mathematical formula, it is assumed that the external magnetic field is a sine wave having a single frequency by way of example.

Suppose that an external magnetic field is Ho, and the size per unit length of induced current flowing in the circumference direction of the cylinder is j. In case the length in the axial direction is relatively longer than the radius, the strength of the induced magnetic field inside the cylinder becomes j. When considering a demagnetizing field, the induced magnetic field becomes a little smaller than j. Because of this, it is assumed that the strength of the induced magnetic field is $\alpha \times j$ (where $\alpha$ satisfies the inequality of $0.5 < \alpha < 1$ for convenience). The demagnetizing field means that, when a magnet such as a bar magnet is magnetized by applying an external magnetic field, a magnetic field is created inside the bar magnet in opposite direction to the external magnetic field due to stimuli caused at both ends of the bar magnet. Since the external magnetic field is a source of the induced current and the induced magnetic field at this time, if the external magnetic field is time dependent in the form of $e^{-iwt}$, both the induced current and the induced magnetic field become time dependent in the same form of $e^{-iwt}$.

The total magnetic field H created on the cross-section of a cylinder in a direction parallel to the axial direction can be represented as follows:

$$H = H_o + \alpha \cdot j \quad \text{Eq. (1)}$$

An Electromotive Force (EMF) generated in the circumference direction of the cylinder can be expressed as:

$$\begin{aligned} EMF &= -\frac{d\Phi}{dt} \\ &= -\pi r^2 \frac{dB}{dt} \\ &= -\mu_o \pi r^2 \frac{dH}{dt} \\ &= -\mu_o \pi r^2 \frac{d(H_o + \alpha \cdot j)}{dt} \\ &= i\omega \mu_o \pi r^2 (H_o + \alpha \cdot j) \end{aligned} \quad \text{Eq. (2)}$$

This equals to a voltage drop by a resistance component when the induced current flows in the circumference direction, and thus can be rewritten as follows:

$$i\omega \mu_o \pi r^2 (H_o + \alpha \cdot j) = 2\pi r \rho \cdot j \quad \text{Eq. (3)}$$

In Eq. (2), $\Phi$ denotes a magnetic flux, B indicates a magnetic flux density, and $\rho$ is a resistance per unit length in the circumference direction of a cylinder.

Rearranging Eq. (3) in terms of j, Eq. (4) can be obtained as:

$$j = -\frac{i\omega \mu_o \pi r^2 H_o}{i\omega \mu_o \pi r^2 \alpha - 2\pi r \rho} = -\frac{H_o}{\alpha - \frac{2\rho}{i\omega \mu_o r}} \quad \text{Eq. (4)}$$

By plugging Eq. (4) into Eq. (1), the total strength of a magnetic field inside the cylinder can be calculated as follows:

$$H = H_O + \alpha \cdot j = H_O \left( 1 - \frac{1}{\alpha + i\frac{2\rho}{\omega \mu_o r}} \right) \quad \text{Eq. (5)}$$

When a conductor has a very low resistance, the second term of the denominator in the bracket of Eq. (5) becomes very small and thus can be expressed as follows:

$$H \approx H_O \left( 1 - \frac{1}{\alpha} \right) \quad \text{Eq. (6)}$$

Figure 2A:
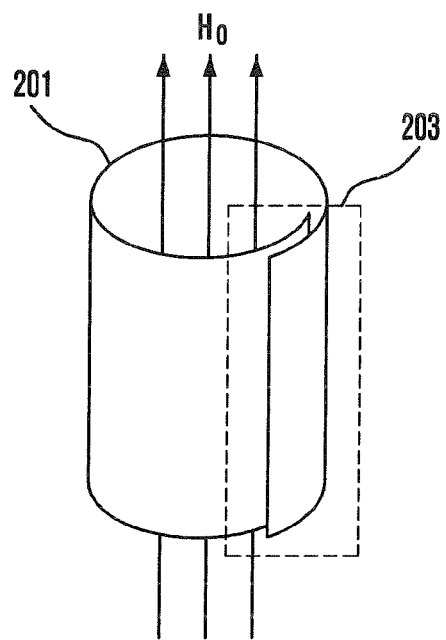
FIG. 2A and FIG. 2B are views for explaining a magnetic field amplifying device with a conventional Swiss roll structure.
Figure 2B:
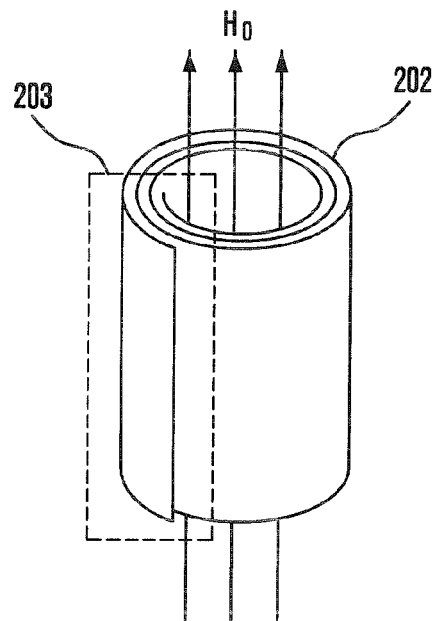

FIGS. 2A and 2B show slightly modified shapes of the cylinder depicted in FIG. 1, in which a thin rectangular metal conductive sheet is wound overlappingly at the end. This corresponds to an electromagnetic device 201 called a Swiss roll for amplifying a magnetic field.

Figure 3A:
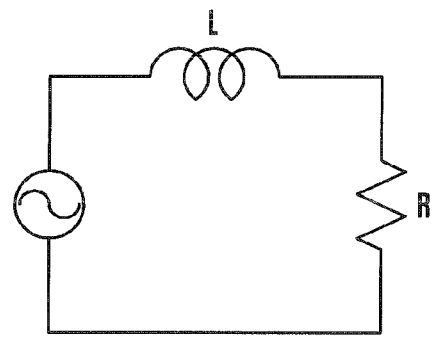
FIG. 3A is an equivalent circuit of FIG. 1.
Figure 3B:
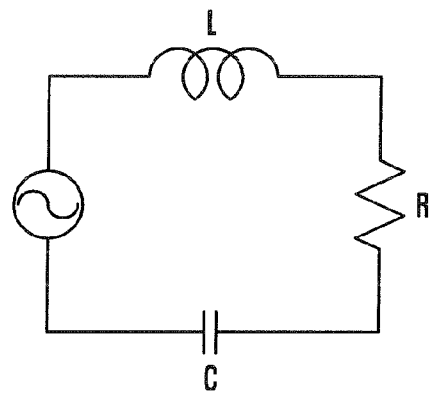
FIG. 3B is an equivalent circuit of a conventional Swiss roll.

In the Swiss roll structure, a parasitic capacitance component is created between an overlapped portion 203 on both ends of the metal sheet. To express this in electric circuit components, the simple cylinder shown in FIG. 1 becomes a circuit where an inductance L and a resistor R are connected in series to a voltage source as shown in FIG. 3A, while the Swiss roll shown in FIGS. 2A and 2B becomes a serial resonance circuit, which has a capacitance component in addition to the inductance and the resistor connected to a voltage source, as shown in FIG. 3B.

When an external magnetic field passing through the cylinder in an axial direction is changed, a voltage proportional to the rate of external magnetic field changes is induced along the circumference of the Swiss roll, and the induced current flows in that direction. Unlike the simple cylinder shape, since the Swiss roll is a serial resonance circuit, if the frequency of the external magnetic field is the same as the resonance frequency of the Swiss roll, the induced current becomes very great, which causes a large induced magnetic field to amplify the external magnetic field strength. Supposing that capacitance at the overlapped portion is C, Eqs. (3) and (4) can be rewritten as Eqs. (7) and (8) given below, respectively, when taking the impedance with the capacitance into consideration.

$$EMF = i\omega\mu_O \pi r^2 (H_O + \alpha \cdot j) = 2\pi r\rho \cdot j - \frac{j}{i\omega C} \quad \text{Eq. (7)}$$

$$j = \frac{-i\omega\mu_o \pi r^2 H_o}{i\omega\mu_o \pi r^2 \alpha - 2\pi r\rho + \frac{1}{i\omega C}} = \frac{-H_o}{\alpha - \frac{1}{\omega^2 \mu_o \pi r^2 C} + i\frac{2\rho}{\omega\mu_o r}} \quad \text{Eq. (8)}$$

Plugging Eqs. (8) into Eq. (1), Eq. (9) can be obtained as follows:

$$H = H_O + \alpha \cdot j \quad \text{Eq. (9)}$$

$$= H_O \left( 1 - \frac{\alpha}{\alpha - \frac{1}{\omega^2 \mu_o \pi r^2 C} + i\frac{2\rho}{\omega\mu_o r}} \right)$$

In Eq. (9), if the metal sheet has a very small resistance ($\rho$), and if $$\frac{1}{\omega^2 \mu_o \pi r^2 C} \approx \alpha,$$

the second term in the bracket in Eq. (9) becomes very large, which has the same effect as the magnetic field inside the cylinder is amplified. In another notation since $\mu_o \pi r^2$ term usually represents inductance L of a cylindrical metal sheet per unit axial length, the resonance condition can be rewritten as $$\frac{1}{\omega^2 LC} \approx \alpha.$$

Therefore, the cylinder shape Swiss roll having a capacitance component added thereto has the function of amplifying an external magnetic field of a specific frequency. However, the problem with using the Swiss roll is that the frequency of an external magnetic field is mostly determined in advance. Thus, 'r' and 'C' in Eq. (9) should be finely adjusted in order to match the resonance frequency of the Swiss roll with the frequency of an external magnetic field.

There is no easy way in the existing Swiss roll to do such thing since it has distributed inductance and capacitance components determined by the geometrical factors. Hence, the present invention employed discrete capacitors and inductors whose capacitance and inductance can be adjusted, such that the resonance frequency of the Swiss roll can be adjusted easily and a usable band can be varied, thereby making it possible to use a single Swiss roll under various external magnetic field conditions of different frequencies.

Figure 4A:
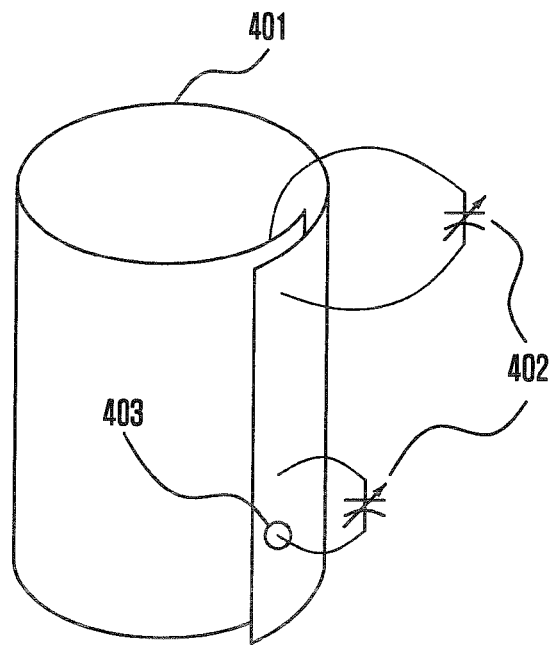
FIG. 4A illustrates the structure of a magnetic field amplifying device in accordance with one embodiment of the present invention.
Figure 4B:
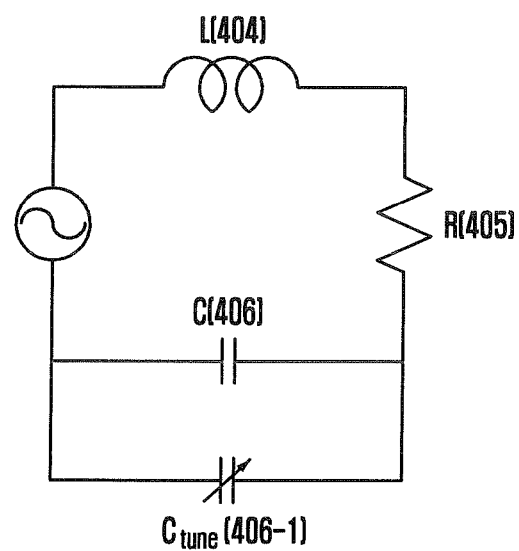
FIG. 4B is an equivalent circuit of FIG. 4A.

FIG. 4A illustrates the structure of a Swiss roll, which is a magnetic field amplifying device, in which discrete tunable capacitors 402 are connected between an inner metal sheet and an outer metal sheet. FIG. 4B shows an equivalent circuit of FIG. 4A.

As shown in FIG. 4A, the magnetic field amplifying device in accordance with the present invention is further provided with tunable capacitors 402 connected between the inner and the outer metal sheet in the general Swiss roll. In the equivalent circuit diagram as shown in FIG. 4B, the tunable magnetic field amplifying device of the present invention further has a tunable capacitor 406-1 connected parallely to the parasitic capacitor 406, in the general Swiss roll structure which is consisted of an inductor (L) 404, a resistor (R) 405, and a parasitic capacitor (C) 406. Therefore, by adjusting the capacitance of the tunable capacitor 406-1, the invention magnetic field amplifying device can easily change the resonance frequency of a Swiss roll.

Moreover, in a Swiss roll structure in which a sheet is wound once or several times, the innermost metal sheet and the outermost metal sheet may be connected via a through hole 403.

As the tunable capacitor, either a voltage controlled varactor or a mechanically adjusted capacitor may be used.

Figure 5A:
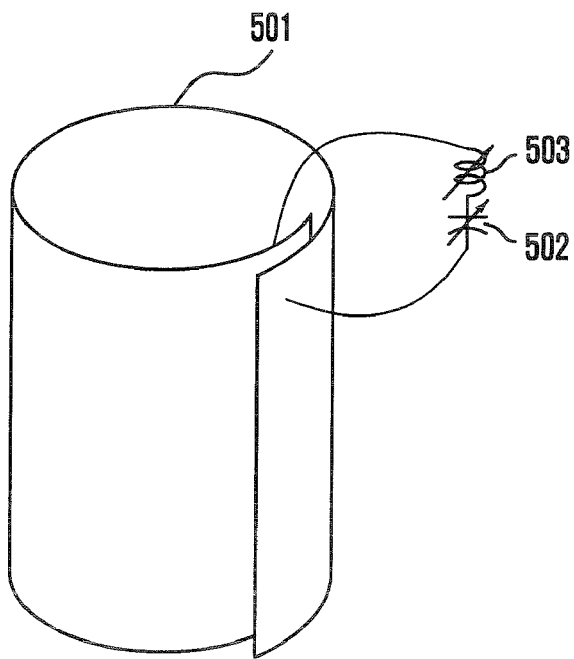
FIG. 5A illustrates the structure of a magnetic field amplifying device in accordance with another embodiment of the present invention.
Figure 5B:
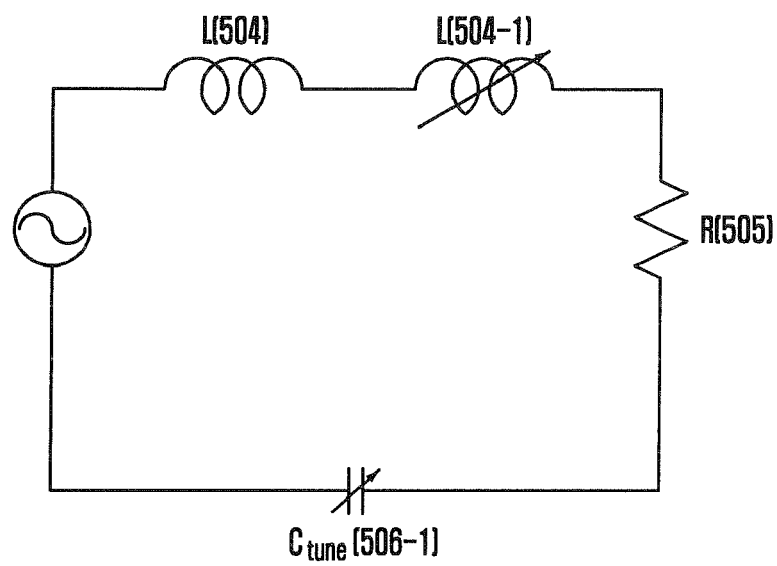
FIG. 5B is an equivalent circuit of FIG. 5A.

Meanwhile, the magnetic field amplifying device in accordance with the present invention may employ a tunable inductor to change the resonance frequency. In other words, the magnetic field amplifying device of the present invention has a tunable inductor connected between the inner and the outer metal sheet, in the structure of the existing Swiss roll. Thus, the present invention can use the tunable inductor to vary the resonance frequency of the Swiss roll. FIG. 5A illustrates a magnetic field amplifying device in accordance with another embodiment of the present invention, and FIG. 5B is an equivalent circuit of FIG. 5A.

The magnetic field amplifying device of this embodiment is characterized by connecting a tunable inductor serially to a tunable capacitor. If a parasitic capacitance at an overlapped portion of a metal sheet is very small, an equivalent circuit of FIG. 5A reduces to FIG. 5B.

In other words, the magnetic field amplifying device in accordance with another embodiment of the present invention has a structure that a tunable capacitor 502 and a tunable inductor 503 are serially connected between the inner sheet and the outer sheet of a metal sheet, in the structure of a conventional Swiss roll. As shown in FIG. 5B, the magnetic field amplifying device of this embodiment is configured in a manner that a structure that a tunable inductor 504-1 and a tunable capacitor 506-1 are serially connected to each other, in the structure of a conventional Swiss roll consisting of an inductor (L) 504, a resistor (R) 505, and a parasitic capacitor (this is omitted in FIG. 5B if it is very small). Therefore, by adjusting the tunable capacitor and the tunable inductor, the magnetic field amplifying device of this embodiment can further increase the tunable range of the resonance frequency of a Swiss roll.

As described above, the present invention can easily tune the resonance frequency of the Swiss roll to the frequency of an external magnetic field to be amplified and allows a Swiss roll to be used in a very wide range, by adding tunable capacitors and inductors consisting of discrete elements. Such a Swiss roll can be broadly used in a magnetic field sensor, and particularly, when the Swiss roll can be used for the MRI, it can improve the resolution of MRI images without incurring extra charge.

While the present invention has been described with respect to the specific embodiments, it will be apparent to those skilled in the art that various changes and modifications may be made without departing from the spirit and scope of the invention as defined in the following claims.

What is claimed is:

1. A tunable magnetic field amplifying device, comprising:
    a Swiss roll formed by winding a metal sheet coated with a dielectric in a spiral cylinder shape once or several times; and
    a tunable capacitor connected between an inner sheet of and an outer sheet of the metal sheet for tuning a resonance frequency.

2. The device of claim 1, further comprising:
    a tunable inductor connected serially to the tunable capacitor for increasing a tunable range of the resonance frequency.

3. The device of claim 1, wherein the inner sheet and the outer sheet are coupled via a through hole.

4. The device of claim 1, wherein the tunable capacitor is a varactor that can be controlled by a voltage.

5. The device of claim 1, wherein the tunable capacitor is a capacitor that is mechanically adjustable.

6. The device of claim 2, wherein the inner sheet and the outer sheet are coupled via a through hole.

7. The device of claim 2, wherein the tunable capacitor is a varactor that can be controlled by a voltage.

8. The device of claim 2, wherein the tunable capacitor is a capacitor that is mechanically adjustable.

9. A tunable magnetic field amplifying device, comprising:
    a Swiss roll formed by winding a metal sheet coated with a dielectric in a spiral cylinder shape once or several times; and
    a tunable inductor connected between an inner sheet of and an outer sheet of the metal sheet for tuning a resonance frequency.

10. The device of claim 9, wherein the inner sheet and the outer sheet are coupled via a through hole.

* * * * *